(12) United States Patent
Boivin

(10) Patent No.: US 7,315,071 B2
(45) Date of Patent: Jan. 1, 2008

(54) MAGNETIC RAM

(75) Inventor: Philippe Boivin, Venelles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 11/323,060

(22) Filed: Dec. 30, 2005

(65) Prior Publication Data

US 2006/0145198 A1 Jul. 6, 2006

(30) Foreign Application Priority Data

Dec. 30, 2004 (FR) .................................. 04 53260

(51) Int. Cl.
*H01L 29/82* (2006.01)
(52) U.S. Cl. ..................... 257/423; 438/3; 257/E21.665
(58) Field of Classification Search ..................... 438/3; 257/295, E21.665; 365/8, 32, 33, 66, 158
See application file for complete search history.

(56) References Cited

U.S. PATENT DOCUMENTS 6,673,675 B2   1/2004  Yates et al.
6,890,770 B2 * 5/2005  Grynkewich et al. .......... 438/3
2004/0012056 A1  1/2004  Nejad et al.
2004/0027844 A1 * 2/2004  Nejad et al. .................. 365/1
2004/0052127 A1  3/2004  Suzuki et al.

OTHER PUBLICATIONS

French Search Report from French Patent Application 04/53260 filed Dec. 30, 2004.
French Search Report from French Patent Application 04/53261 filed Dec. 30, 2004.

* cited by examiner

*Primary Examiner*—Lex Malsawma
*Assistant Examiner*—Jae Lee
(74) *Attorney, Agent, or Firm*—Lisa K. Jorgenson; James H. Morris; Wolf, Greenfield & Sacks, P.C.

(57) ABSTRACT

A memory element for a magnetic RAM, contained in a recess of an insulating layer, the recess including a portion with slanted sides extending down to the bottom of the recess, the memory element including a first magnetic layer portion substantially conformally covering the bottom of the recess and the recess portion with slanted sides and in contact, at the level of the bottom of the recess, with a conductive portion, a non-magnetic layer portion substantially conformally covering the first magnetic layer portion and a second magnetic layer portion covering the non-magnetic layer portion.

4 Claims, 4 Drawing Sheets

MAGNETIC RAM

BACKGROUND OF THE INVENTION

1. Field of the Invention

The present invention relates to a magnetic random access memory or MRAM and a method for manufacturing such a memory.

2. Discussion of the Related Art

FIG. 1 illustrates the operation of a magnetic RAM. Such a memory comprises an array of memory elements arranged in rows and in columns, a single memory element 10 being shown in FIG. 1. Each memory element 10 is formed of the stacking of three layers: a first layer 12 formed of a magnetic material, for example, cobalt, having a fixed magnetic orientation, a second layer 14 formed of an insulator, and a third layer 16 formed of a ferromagnetic material, for example, a cobalt and iron alloy or a nickel and iron alloy, the magnetic orientation of which can vary. Insulating layer 12 behaves as a barrier to prevent the alloying between magnetic layer 12 and ferromagnetic layer 16 and to enable the passing of electrons, the spin of which must be maintained. Generally, each layer of the memory element may itself be formed of several layers. All the memory elements 10 of a same array column are connected to a conductive track 18, behaving as a bit line. A conductive track 20 is arranged above the memory elements 10 of a same array row but is not in electric contact with the memory elements of the row.

For each memory element 10 in the array, first layer 12 is connected via a portion 22 of connection to the drain (or to the source) of an N- or P-channel MOS transistor 24 having its source (or its drain) connected to a reference voltage, for example, ground GND. The gate of MOS transistor 24 is controlled by a gate control signal SG. The MOS transistor associated with each memory element may be replaced with a diode circuit. MOS transistor 24 has the function of selecting in read mode the memory element 10 to be addressed.

As an example, magnetic layer 12 of memory element 10 has a magnetic moment vector with a fixed orientation, whatever the amplitude of the magnetic field in which the memory element is bathed. Ferromagnetic layer 16 then has a magnetic moment vector with an orientation that can be modified by applying a magnetic field. As an example, binary data may be stored in the memory element by orienting the magnetic moment vector of ferromagnetic layer 16 in parallel or in antiparallel with respect to the magnetic moment vector of magnetic layer 12.

A data write operation into memory element 10 is performed by flowing a current through bit line 18 and bit line 20 associated with the memory element. The flowing of a current in bit line 18 causes the forming of a magnetic field having the general orientation of the field lines represented by arrow 26. Similarly, the flowing of a current in word line 20 causes the forming of a magnetic field having the general orientation of its field lines represented by arrow 28. According to the flow direction of the current in bit line 18 and word line 20, the magnetic moment vector of ferromagnetic layer 16 is oriented in parallel or in antiparallel with respect to the magnetic moment vector of magnetic layer 12. In a write operation, MOS transistor 24 is on.

An operation of reading of the binary data stored in memory element 10 is performed by turning off transistor 24 associated with memory element 10 and by flowing a current therein via bit line 18. The determination of the data stored in the memory element is based on the difference of the resistance of memory element 10 according to the orientation difference of the magnetic moment vectors of ferromagnetic layer 16 and of magnetic layer 12.

FIGS. 2A to 2G show successive steps of a conventional example of a method for manufacturing such a memory element 10 in integrated form. Such a method is especially described in U.S. Pat. No. 6,673,675, which is incorporated herein by reference.

As shown in FIG. 2A, the magnetic memory is formed on a substrate 30, for example, polysilicon, comprising insulation trenches 32 insulating the memory elements from one another. Two N-type doped regions 34, 36 form the source and drain regions of MOS transistor 24. The gate of MOS transistor 24 is formed of the stacking of a gate oxide layer 38, for example, silicon oxide, and of a gate layer 40, for example, polysilicon. Substrate 30 and the gate of MOS transistor 24 are covered with an insulating layer 42. A connection portion 44, for example, metallic, is buried at the surface of insulating layer 42 and is connected to doped region 36 via a contact 46. A connection portion 48, for example, metal, is buried at the surface of insulating layer 42 and is connected to doped region 34 via a via 50. Connection portion 48 is intended to be grounded. A conductive track 52, for example, metal, is buried at the surface of insulating layer 42 and forms word line 20.

FIG. 2B shows the structure obtained after having covered insulating layer 42 with an insulating layer 54, and having formed, in insulating layer 54, a connection portion 56, for example, metal, in contact with connection portion 44.

FIG. 2C shows the structure obtained after having covered insulating layer 54 with an insulating layer 58 and formed, in insulating layer 58, a connection portion 60, for example, metal, in contact with connection portion 56 and which extends substantially above word line 52.

FIG. 2D shows the structure obtained after having covered insulating layer 54 with an insulating layer 62 and etched a recess 64 with substantially straight sides in insulating layer 54, exposing a portion of connection portion 60.

FIG. 2E shows the structure obtained after having deposited, for example, by vapor phase deposition or cathode sputtering, on insulating layer 62, a magnetic layer 66, an insulating layer 68, a ferromagnetic layer 70, and a conductive layer 72, for example, metal. The deposited layers penetrate into recess 64 so that magnetic layer 66 is in contact with connection portion 60. Generally, magnetic layer 66 has a thickness of some ten nanometers, insulating layer 68 has a thickness of a few nanometers, and ferromagnetic layer 70 has a thickness of from some ten nanometers to a few tens of nanometers.

FIG. 2F shows the structure obtained after a chem./mech polishing (CMP) of layers 66, 68, 70, 72 down to insulating layer 62. A memory element 73 formed of the stacking of magnetic, insulating, and ferromagnetic portions 74, 75, and 76 is thus insulated. Portions 74, 75, 76 thus defined comprise corner areas 77, 78, 79. In other words, the resulting structure of memory element 73 after the planarization step has a "U"-shaped cross-section. Such corner areas 77, 78, 79 are undesirable since it is difficult to control the thickness of insulating portion 75 at the level of corner area 77. In particular, there is a risk for the thickness of insulating portion 75 to be locally decreased at the level of corner area 77. This may cause the occurrence of leakage currents between magnetic portion 74 and ferromagnetic portion 76, altering the operation of memory element 73. It is thus desirable to eliminate corner areas 77, 78, 79.

FIG. 2G shows the structure obtained after etching of corner areas 77, 78, 79 of memory element 73. A memory element 73 in which magnetic, insulating, and ferromagnetic portions 74, 75, and 76 are substantially planar is then obtained.

A disadvantage is that the materials generally used to form the memory elements are little reactive with chemical etches conventionally used in integrated circuit manufacturing processes, since there is no forming of volatile compounds. It is thus necessary to use RIE-type etches (reactive ion etching) to eliminate corner areas 77, 78, 79 from memory element 73. A disadvantage of such etchings is that the materials etched by an RIE-type etch tend to deposit back onto the walls of the etch chamber and/or onto other portions of the integrated circuit. This may result in a soiling of the etch chamber, and/or, which is much more disturbing, in the occurrence of defects at the integrated circuit level.

SUMMARY OF THE INVENTION

The present invention aims at obtaining a memory element for a magnetic RAM exhibiting no "corner areas" and capable of being formed by a process comprising no RIE-type etch steps.

Another object of the present invention is to provide a method for manufacturing such a memory element which is compatible with manufacturing processes generally used for integrated circuits.

Another object of the present invention is to provide a method for manufacturing such a memory element which only slightly modifies the steps of the general RAM manufacturing process.

For this purpose, the present invention provides a memory element for a magnetic RAM, contained in a recess of an insulating layer, the recess comprising a portion with slanted sides extending down to the bottom of the recess. The memory element comprises a first magnetic layer portion substantially conformally covering the bottom of the recess and the recess portion with slanted sides and in contact, at the level of the bottom of the recess, with a conductive portion, a non-magnetic layer portion substantially conformally covering the first magnetic layer portion and a second magnetic layer portion covering the non-magnetic layer portion.

According to an embodiment of the present invention, the recess further comprises a portion with straight sides which prolongs down to the bottom of the recess by the portion with slanted sides, the first magnetic layer portion substantially conformally covering the recess portion with straight sides and the recess portion with slanted sides and being in contact, at the level of the bottom of the recess, with the conductive portion, the non-magnetic layer portion substantially conformally covering the first magnetic layer portion and the second magnetic layer portion covering the non-magnetic layer portion.

According to an embodiment of the present invention, the first magnetic portion is connected to a source or drain region of a field-effect transistor.

The present invention also provides a magnetic random access memory comprising an array of memory elements, such as described previously, distributed in rows and in columns, and comprising, for each row, a conductive track extending along the row and intended for the writing of data into the memory elements of the row, the memory elements of the row being arranged at the level of the conductive track with an interposed insulating layer.

The present invention also provides a magnetic random access memory comprising an array of memory elements, such as described previously, distributed in rows and in columns, and comprising, for each row, two conductive tracks extending along the row and intended for the writing of data into the memory elements of the row, the memory elements of the row being arranged at the level of the plane equidistant from the two conductive tracks.

The present invention also provides a method for manufacturing a magnetic random access memory element comprising the steps of providing a conductive portion in a first recess of a first insulating layer; forming a second insulating layer; digging a second recess comprising straight sides on a first portion and slanted sides on a second portion and exposing at least a portion of the connection portion; forming, in the second recess and on the second insulating layer, a first magnetic layer, a non-magnetic layer, and a second magnetic layer; and etching, by chem.-mech polishing, the second magnetic layer, the non-magnetic layer, the first magnetic layer, and a portion of the second insulating layer to delimit a first magnetic portion, a non-magnetic portion, a second magnetic portion in the second recess.

According to an embodiment of the present invention, the second insulating layer is formed of the stacking of third and fourth insulating layers formed of different materials, the first portion with straight sides of the recess being formed in the third insulating layer and the second portion with slanted sides of the recess being formed in the fourth insulating layer.

According to an embodiment of the present invention, the fourth insulating layer is etched entirely in the chem.-mech polishing step.

According to an embodiment of the present invention, the method comprises providing a silicon substrate at the level of which is formed a doped region; forming an insulating layer; forming an intermediary connection portion connected with the doped region and a conductive track adjacent to the intermediary connection portion, the conductive track being intended for the writing of data into the memory element; forming an insulating layer; forming a connection portion in contact with the intermediary connection portion and overhanging the conductive track; and forming said memory element at the level of said conductive track, the first magnetic portion being connected to the connection track.

According to an embodiment of the present invention, the method comprises providing a silicon substrate at the level of which is formed a doped region; forming an insulating layer; forming a connection portion connected with the doped region and two conductive tracks on either side of the connection portion, the two conductive tracks being intended for the writing of data into the memory element; and forming said memory element at the level of the plane equidistant to the two conductive tracks, the first magnetic portion being connected to the connection track.

The foregoing and other objects, features, and advantages of the present invention will be discussed in detail in the following non-limiting description of specific embodiments in connection with the accompanying drawings.

DETAILED DESCRIPTION

Figure 1:
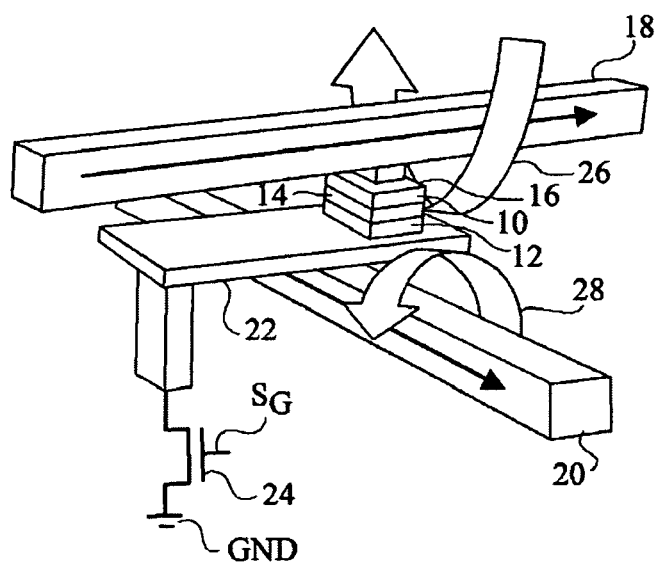
FIG. 1, previously described, illustrates the operation of a magnetic RAM.

For clarity, the same elements have been designated with the same reference numerals in the different drawings and, further, as usual in the representation of integrated components, the various drawings are not to scale.

A first example of a process according to the present invention for manufacturing a magnetic RAM memory element will now be described in relation with FIGS. 3A to 3E. The initial steps of the first method example correspond to the steps previously described in relation with FIGS. 2A to 2C.

Figure 2A:
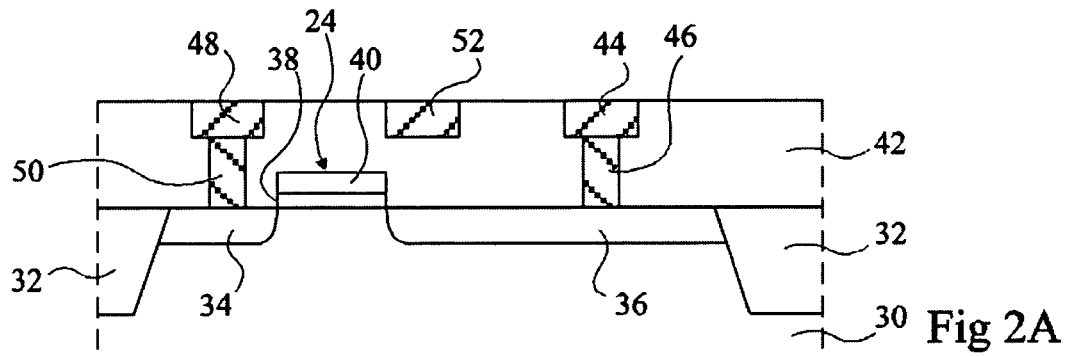
FIGS. 2A to 2G, previously described, illustrate successive steps of an example of a conventional method for manufacturing a magnetic RAM memory element.
Figure 2B:
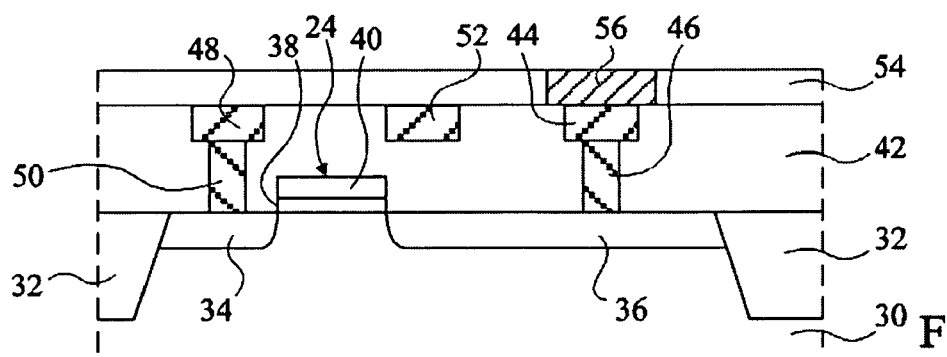
Figure 2C:
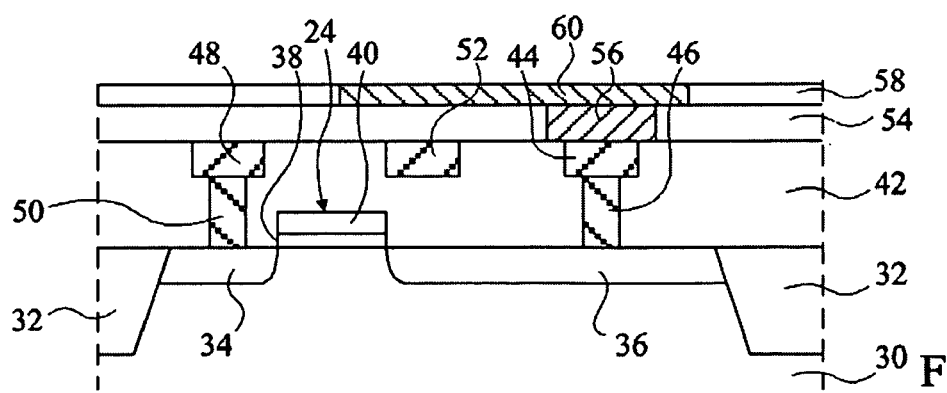
Figure 2D:
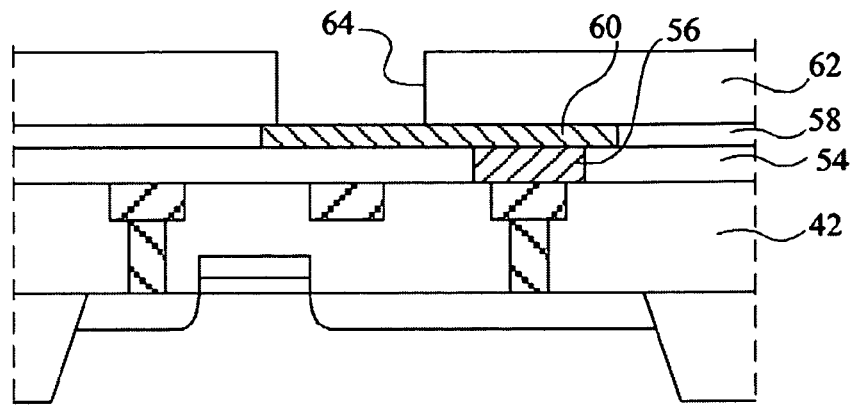
Figure 2E:
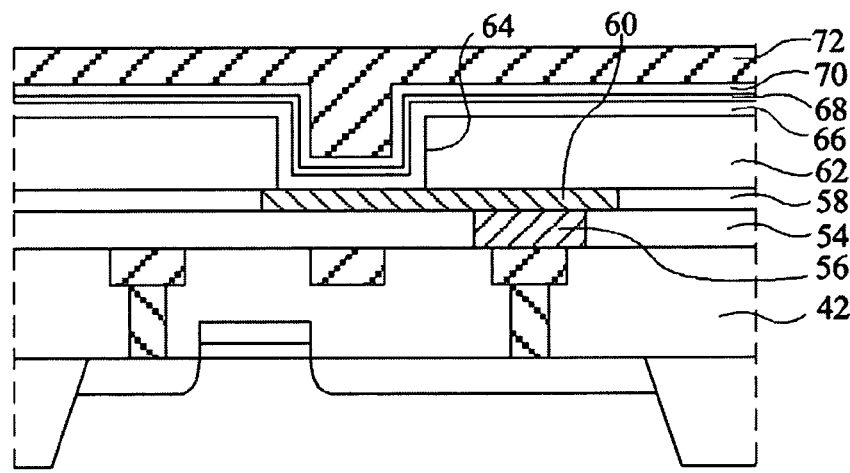
Figure 2F:
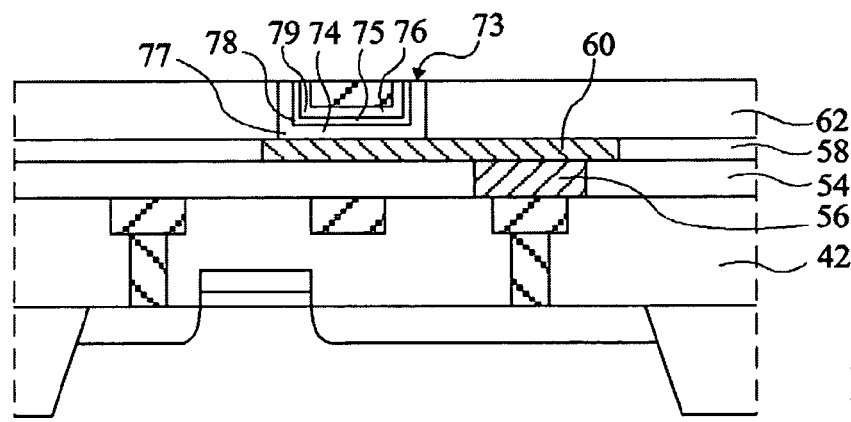
Figure 2G:
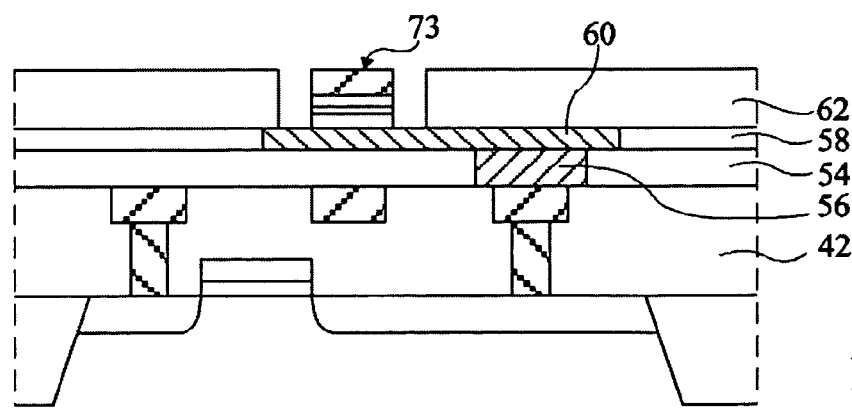
Figure 3A:
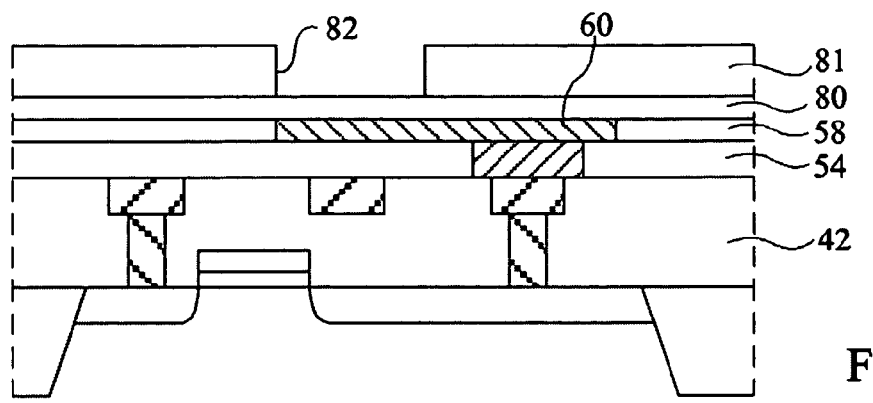
FIGS. 3A to 3E illustrate successive steps of a first example of a method according to the present invention for manufacturing a magnetic RAM memory element.

FIG. 3A shows the structure obtained after a step of deposition of two insulating layers 80, 81 formed of different materials on the structure of FIG. 2C. It may be a nitride layer 80 and an oxide layer 81. A recess 82 is etched through the entire depth of oxide layer 81. Nitride layer 80 may behave as a stop layer in the etching of recess 82. The selected etching is such that recess 82 has substantially straight sides.

Figure 3B:
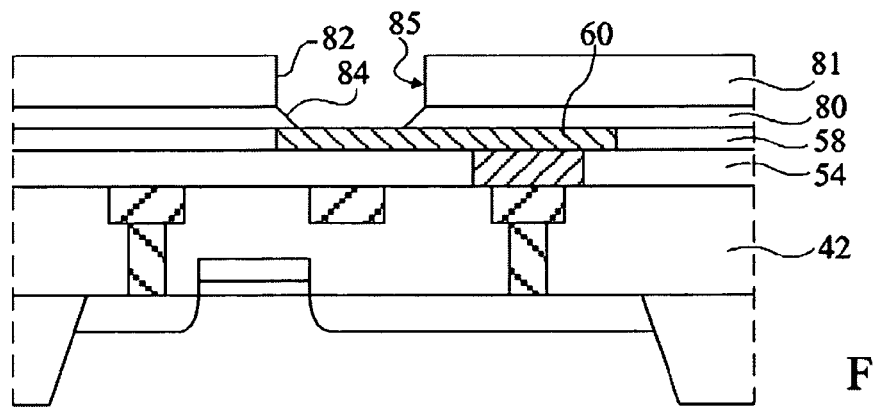

FIG. 3B shows the structure obtained after a step of additional etching of nitride layer 80 at the level of the bottom of recess 82 to form an additional recess 84 which continues recess 82 and exposes a portion of the surface of connection portion 60. The etching selected to form recess 84 is such that the sides of recess 84 are substantially slanted with respect to the stacking direction of insulating layers 42, 54, 58, 80, 81. A recess 85 having, on a first portion, straight sides and, on a second portion, slanted sides is finally obtained.

Figure 3C:
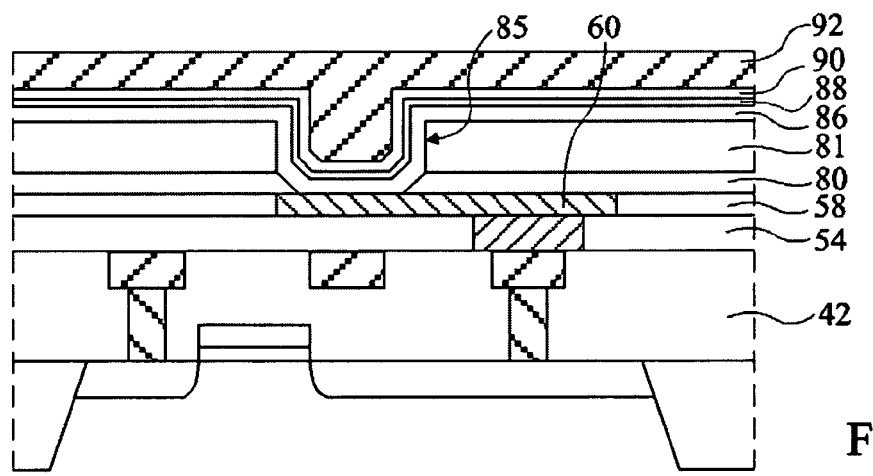

FIG. 3C shows the structure obtained after the successive depositions, on insulating layer 81 and in recess 85, of a magnetic layer 86, for example, cobalt-based, of an insulating layer 88, of a ferromagnetic layer 90, for example, based on a cobalt and iron alloy or on a nickel and iron alloy, and of a conductive layer 92, for example, metal. The depositions of magnetic, insulating, and ferromagnetic layers 86, 88, and 90 may be performed by vapor-phase deposition or by cathode sputtering.

Figure 3D:
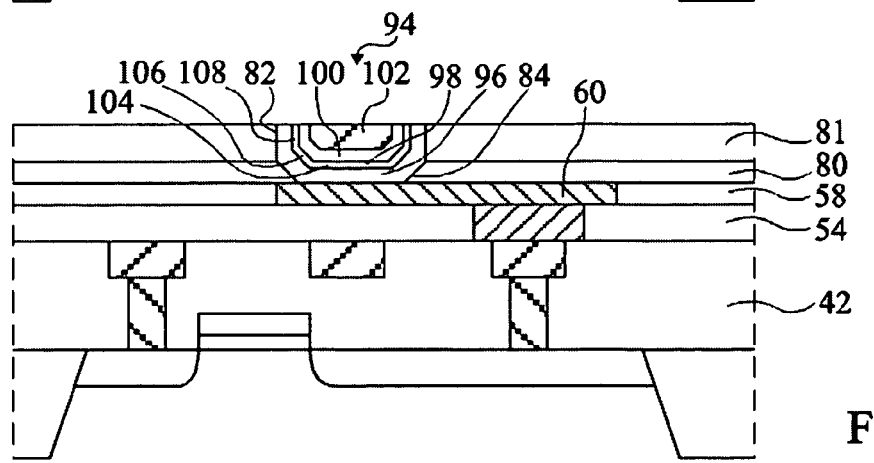

FIG. 3D shows the structure obtained after a step of chem./mech polishing of layers 92, 90, 88, 86, and of a portion of insulating layer 81 to delimit a memory element 94 at the level of recess 85 formed of the stacking of a magnetic layer portion 96, of an insulating portion 98, of a ferromagnetic layer portion 100, and of a conductive portion 102. Insulating layer 98 reproduces the shapes of recess 85 and comprises a substantially horizontal portion 104 opposite to connection portion 60, slanted portions 106, prolonging horizontal portion 104, and located substantially opposite to the slanted sides of recess 84 and vertical portions 108, prolonging slanted portions 106, and located substantially opposite to the vertical sides of recess 82.

Figure 3E:
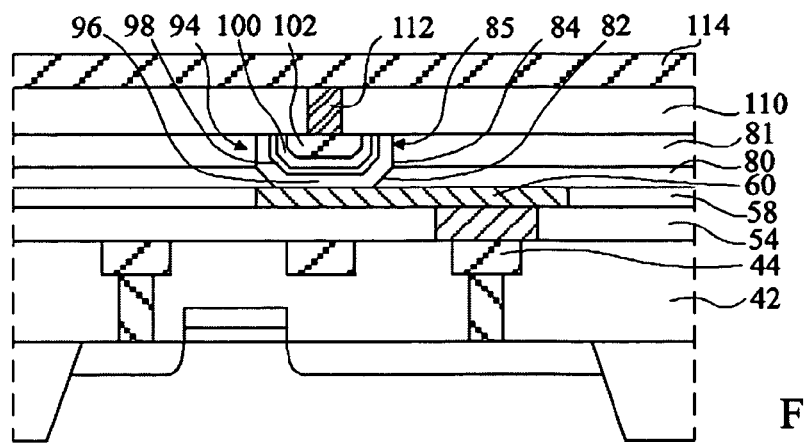

FIG. 3E shows the structure obtained after a step in which insulating layer 81 has been covered with an insulating layer 110, a via 112 has been formed in insulating layer 110, coming to contact conductive portion 102 of memory element 94, and a conductive track 114 has been formed on insulating layer 110 in contact with via 98. Conductive track 114 corresponds to the bit line associated with the column of the magnetic RAM to which memory element 94 belongs.

The fact of forming memory element 94 at the level of a recess 85 comprising a portion with slanted sides located between the portion with straight sides and the bottom of recess 85 enables ensuring that insulating layer 88, from which insulating portion 98 is defined, has a more uniform thickness. Risks of local decrease in the thickness of insulating portion 98 have thus been reduced, especially at the level of the junction between slanted portions 106 and horizontal portion 104, and slanted portions 106 and vertical portions 108. Further, the fact of providing the portion with slanted sides of recess 85 only close to the bottom of recess 85 enables keeping a contact surface between magnetic portion 96 and underlying connection portion 60 of relatively significant dimensions with respect to the dimensions of memory element 94.

According to a variation of the first example of embodiment, in the case where the thickness of layer 81 is sufficient for the stacking of layers 86, 88, 90, 92 to be contained in recess 84, layer 81 may be totally etched in the planarization step implemented to delimit memory element 94. Layer 80 then plays the role of an etch stop layer in the chem./mech polishing step. Magnetic, insulating, ferromagnetic, and conductive portions 96, 98, 100, and 102 are then contained in recess 84.

A second example of a method for manufacturing according to the present invention a magnetic memory element will now be described in relation with FIGS. 4A to 4D.

Figure 4A:
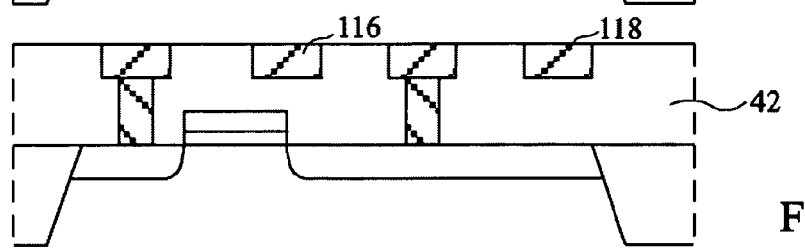
FIGS. 4A to 4D illustrate steps of a second example of a magnetic RAM memory element manufacturing method according to the present invention.

FIG. 4A shows a structure similar to that of FIG. 2A. However, conversely to the structure shown in FIG. 2A, two conductive tracks 116, 118 corresponding to two word lines are provided for each row of the magnetic RAM. For each memory element of a same row in the MRAM, conductive tracks 116, 118 extend on either side of connection portion 44.

Figure 4B:
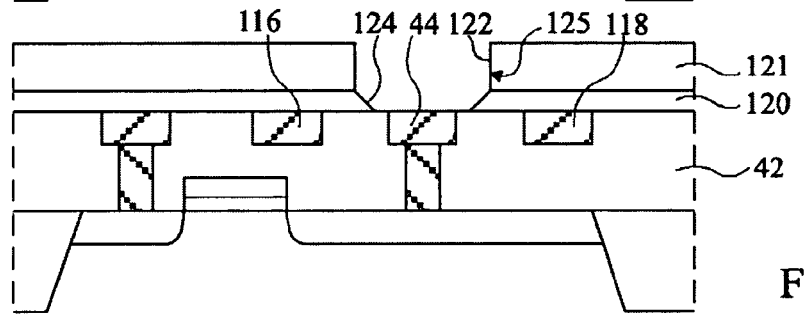

FIG. 4B show the structure obtained after deposition of two insulating layers 120, 121 on insulating layer 42 formed of different materials. It may be a nitride layer 120 and an oxide layer 121. A first recess 122 with substantially straight sides is etched in oxide layer 121, similarly to what is shown in FIG. 3B. A second recess 124, continuing first recess 122, is etched in nitride layer 120, second recess 124 comprising slanted sides and exposing conductive portion 44. A recess 125 having straight sides on a first portion and slanted sides on a second portion is thus obtained.

Figure 4C:
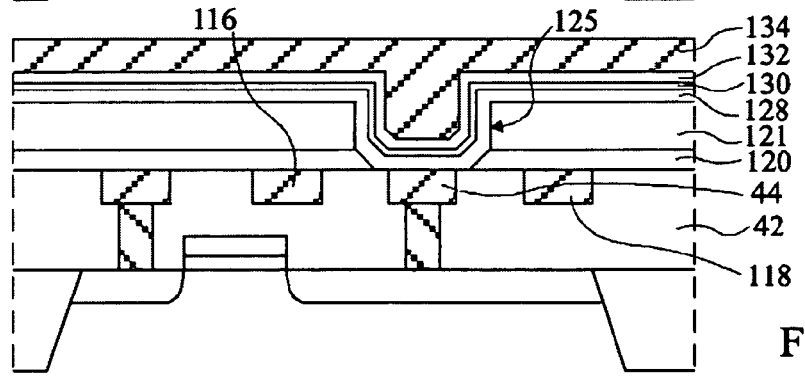

FIG. 4C shows the structure obtained after steps similar to those illustrated in relation with FIG. 3C comprising successively depositing, on insulating layer 121 and in recess 125, a magnetic layer 128, an insulating layer 130, a ferromagnetic layer 132, and a conductive layer 134.

Figure 4D:
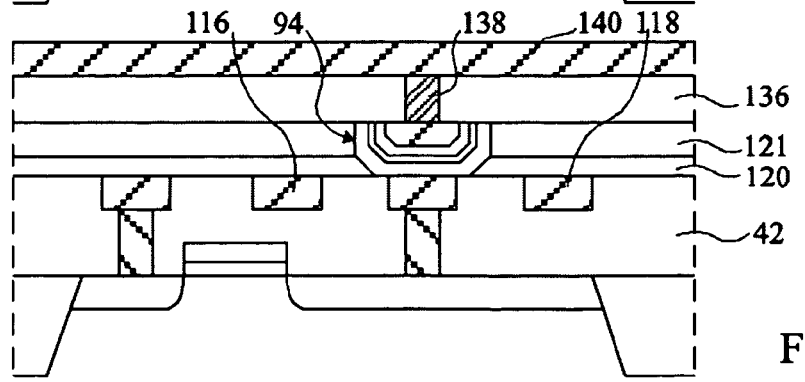

FIG. 4D shows the structure obtained after steps similar to those illustrated in relation with FIGS. 3D and 3E comprising a step of chem./mech polishing of layers 134, 132, 130, 128, and of a portion of layer 121 to delimit memory element 94, of deposition of an insulating layer 136, of forming of a via 138 in insulating layer 136 contacting memory element 94, and of deposition of a conductive track 140 forming the bit line associated with the column comprising memory element 94.

A data write operation into memory element 94 is performed by flowing a current in bit line 114 and currents of opposite directions in word lines 116, 118. A magnetic field having its maximum amplitude substantially at the level of a plane equidistant to word lines 116, 118, that is, substantially at the level of magnetic memory element 94, is then obtained.

In the first example of embodiment in which a single word line 52 is associated with each row of the magnetic RAM, it is necessary for memory element 94 to be arranged above word line 52 to benefit from a magnetic field of maximum amplitude in a write operation. In the second method example, the magnetic field has a maximum amplitude at the level of the plane equidistant from the two word lines 116, 118. This enables arranging memory element 94 above connection portion 44. It is then no longer necessary to provide the steps of deposition of insulating layers 54 and 58 and the steps of forming of connection portions 56 and 60 of the first method example. The second method example thus enables reducing the number of masks to be provided for the memory element manufacturing.

According to a variation of the previously-described examples of embodiment, insulating layers 80, 81, 120, and 121 are replaced with a single insulating layer, for example an oxide layer. A recess 85, 125 comprising straight sides on a first portion and slanted sides on a second portion is then etched in the insulating layer by two different successive etchings.

According to another variation of the previously-described examples of embodiment, the MOS transistor associated with each memory element and used for the reading of the data stored at the level of the memory element may be replaced with a diode circuit.

According to another variation of the previously-described examples of embodiment, a single word line is associated with each row of the magnetic RAM and is connected to all the memory elements in the row. Each memory element is then caught between the bit line and the word line associated with the memory element. An operation of reading of the data stored at the level of a memory element is then performed by running a current through the memory element via the bit line and the word line associated with the memory element. Such an alternative embodiment enables eliminating the MOS transistor associated with each memory element.

The present invention has many advantages:

First, it enables obtaining an element of a magnetic RAM in which the corner areas of the oxide portion of the memory element are eliminated.

Second, the steps of the manufacturing process of each memory element according to the present invention relative to the etching of the materials forming the memory element only implement chem./mech polishing steps instead of RIE-type etches. The disadvantages of RIE-type etches are thus avoided.

Third, the manufacturing process according to the present invention only implements one additional etch step with respect to a conventional manufacturing method. Such a method is thus quite compatible with integrated circuit manufacturing methods.

Fourth, by providing a recess comprising straight sides on a first portion and slanted sides on a second portion, the decrease of the contact surface area between the magnetic portion of the memory element and the underlying portion is limited with respect to a memory element which would be entirely formed in a recess with slanted sides.

Of course, the present invention is likely to have various alterations, modifications, and improvements which will occur to those skilled in the art. In particular, the magnetic layer, the oxide layer, and the ferromagnetic layer based on which the memory element is formed may each be formed of the stacking of several layers.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A memory element for a magnetic RAM, contained in a recess of an insulating layer, the recess comprising a portion with straight sides which prolongs down to the bottom of the recess by a portion with slanted sides, the memory element comprising a first magnetic layer portion substantially conformally covering the bottom of the recess and the recess portion with straight sides and the recess portion with slanted sides and in contact, at the level of the bottom of the recess, with a conductive portion, a non-magnetic layer portion substantially conformally covering the first magnetic layer portion and a second magnetic layer portion covering the non-magnetic layer portion.

2. The memory element of claim 1, wherein the first magnetic portion is connected to a source or drain region of a field-effect transistor.

3. A magnetic RAM comprising an array of memory elements of claim 1, distributed in rows and in columns, and comprising, for each row, a conductive track extending along the row and intended for the writing of data into the memory elements of the row, the memory elements of the row being arranged at the level of the conductive track with an interposed insulating layer.

4. A magnetic RAM comprising an array of memory elements of claim 1, distributed in rows and in columns, and comprising, for each row, two conductive tracks extending along the row and intended for the writing of data into the memory elements of the row, the memory elements of the row being arranged at the level of plane equidistant from the two conductive tracks.

* * * * *